(12) United States Patent
Chaudhuri et al.

(10) Patent No.: US 6,977,537 B2
(45) Date of Patent: Dec. 20, 2005

(54) LOW GAIN PHASE-LOCKED LOOP CIRCUIT

(75) Inventors: Santanu Chaudhuri, Moutain View, CA (US); Sanjay Dabral, Palo Alto, CA (US); Karthisha Canagasaby, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/890,332

(22) Filed: Jul. 13, 2004

(65) Prior Publication Data

US 2004/0246057 A1    Dec. 9, 2004

Related U.S. Application Data

(62) Division of application No. 10/334,276, filed on Dec. 31, 2002, now Pat. No. 6,788,155.

(51) Int. Cl.[7] ................................................ H03L 7/06
(52) U.S. Cl. ...................... 327/156; 327/158; 327/159; 331/17; 331/DIG. 2
(58) Field of Search ................................. 327/156, 157, 327/158, 159, 536; 331/1 R, 2, 17, 10, 46, 331/48–9, DIG. 2; 307/410; 363/59, 60

(56) References Cited

U.S. PATENT DOCUMENTS

| 5,157,354 A | * | 10/1992 | Saiki et al. ................. 331/1 A |
|---|---|---|---|
| 5,315,270 A | * | 5/1994 | Leonowich ................. 331/1 A |
| 5,525,932 A | * | 6/1996 | Kelkar et al. ................ 331/1 A |
| 5,686,864 A | * | 11/1997 | Martin et al. ................ 331/1 A |
| 5,699,020 A | * | 12/1997 | Jefferson ....................... 331/17 |
| 5,861,766 A | * | 1/1999 | Baumer et al. ............. 327/105 |
| 5,933,037 A | * | 8/1999 | Momtaz ..................... 327/157 |
| 5,977,806 A | * | 11/1999 | Kikuchi ...................... 327/157 |
| 5,999,353 A | * | 12/1999 | Hase et al. ................... 360/51 |
| 6,049,255 A | * | 4/2000 | Hagberg et al. .............. 331/17 |
| 6,243,031 B1 | * | 6/2001 | Jusuf et al. ................... 341/68 |
| 6,353,647 B1 | * | 3/2002 | Wilhelmsson et al. ...... 375/376 |
| 6,356,158 B1 | * | 3/2002 | Lesea .......................... 331/11 |
| 6,389,092 B1 | * | 5/2002 | Momtaz ..................... 375/376 |
| 6,476,681 B1 | * | 11/2002 | Kirkpatrick .................. 331/17 |
| 6,490,220 B1 | * | 12/2002 | Merritt et al. .............. 365/226 |
| 6,549,079 B1 | * | 4/2003 | Crook .......................... 331/17 |
| 6,583,675 B2 | | 6/2003 | Gomez |
| 6,687,320 B1 | | 2/2004 | Chiu |
| 6,788,155 B2 | * | 9/2004 | Chaudhuri et al. ........... 331/46 |
| 2001/0016476 A1 | | 8/2001 | Kasahara |
| 2002/0062416 A1 | | 5/2002 | Kim |
| 2002/0087901 A1 | | 7/2002 | Cooper |
| 2002/0130725 A1 | | 9/2002 | Han |

* cited by examiner

Primary Examiner—Timothy P. Callahan
Assistant Examiner—An T. Luu
(74) Attorney, Agent, or Firm—Buckley, Maschoff & Talwalkar LLC

(57) ABSTRACT

According to some embodiments, a low gain phase-locked loop circuit is provided.

20 Claims, 11 Drawing Sheets

```
┌─────────────────────────────────┐
│  DETERMINE FREQUENCY TO BE      │
│  ASSOCIATED WITH A PHASE-       │
│  LOCKED LOOP CIRCUIT            │
│                           602   │
└─────────────────────────────────┘
                │
                ▼
┌─────────────────────────────────┐
│  ARRANGE FOR PHASE-LOCKED       │
│  LOOP CIRCUIT TO GENERATE       │
│  AN OUTPUT CLOCK SIGNAL VIA     │
│  ONE OF A PLURALITY OF          │
│  VOLTAGE CONTROLLED             │
│  OSCILLATORS                    │
│                           604   │
└─────────────────────────────────┘
```

FIG. 6

LOW GAIN PHASE-LOCKED LOOP CIRCUIT

CROSS-REFERENCE TO RELATED APPLICATIONS

The present application is a divisional of U.S. patent application Ser. No. 10/334,276 entitled "Low Gain Phase-Locked Loop Circuit" filed on Dec. 31, 2002 now U.S. Pat. No. 6,788,155.

BACKGROUND

A Phase-Locked Loop (PLL) circuit can be used to generate an output clock signal based on a reference clock signal. For example, FIG. 1 is a block diagram of a known PLL circuit 100. The PLL circuit 100 includes a phase detector 110 that receives a reference clock signal and a feedback clock signal. Based on a difference between these two signals (e.g., a difference in phase or frequency), the phase detector 110 provides up and down signals to a charge pump 120. A Voltage Controlled Oscillator (VCO) 140 generates an output clock signal at a frequency that is based on a signal received from the charge pump 120. That is, an up signal from the phase detector 110 will cause the VCO 140 to increase the frequency of the output clock signal (and a down signal will cause the VCO 140 to decrease the frequency). A divider 150 divides the output clock signal by N to create the feedback clock signal that is provided to the phase detector 110. A loop filter 130 between the charge pump 120 and the VCO 140 may filter a high frequency signal from the charge pump 120 to create a lower frequency signal that can be used to control the VCO 140.

The frequency of the output clock signal generated by the PLL circuit 100 will initially vary. Eventually, however, the PLL circuit 100 "locks" and the output clock signal remains at an appropriate frequency (e.g., based on the frequency of the reference clock signal and the value of N).

Even after the PLL circuit 100 achieves lock, the output clock signal may contain an amount of "jitter" (i.e., variations in the clock signal's rising and falling edges as compared to an ideal clock signal). Note that output jitter may a limiter for embedded clock data recovery based serial links, and thus should be reduced.

In general, the amount of jitter in the output clock signal is related to the overall gain of the PLL circuit 100. In particular, a PLL circuit 100 with a higher gain will have a larger amount of jitter as compared to a PLL circuit with a lower gain in the regime where reference clock jitter is the determinant one and an internal PLL needs it small.

The gain of individual elements in the PLL circuit 100 contribute to the overall gain of the PLL circuit 100. For example, the gain of the VCO 140 will contribute to the overall gain (and jitter) of the PLL circuit 100. Thus, reducing the gain of the VCO 140 will lead to reduced jitter. However, reducing the gain of the VCO 140 will also reduce the range of frequencies at which the VCO 140 can operate—resulting a less versatile PLL circuit 100. Moreover, a PLL circuit 100 associated with an Input Output (IO) system may need to operate at a large range of frequencies (e.g., because of differences that may exist between the PLL circuits in a transmitting device and a receiving device).

The gain of the charge pump 120 also contributes to the overall gain (and jitter) of the PLL circuit 100. Note, however, that a charge pump 120 with a higher gain will achieve lock faster than a charge pump 120 that has a lower gain. That is, reducing the gain associated with the charge pump 120 will cause the PLL circuit 100 to achieve lock more slowly (or even prevent lock from being achieved at all).

BRIEF DESCRIPTION OF THE DRAWINGS

FIG. 6 is a flow chart of a method of setting selection control bits according to some embodiments.

DETAILED DESCRIPTION

Several embodiments of PLL circuits and methods will now be described. Note that the flow charts described herein do not necessarily imply a fixed order to the actions, and embodiments may be performed in any order that is practicable.

Multiple Voltage Controlled Oscillators

Figure 1:
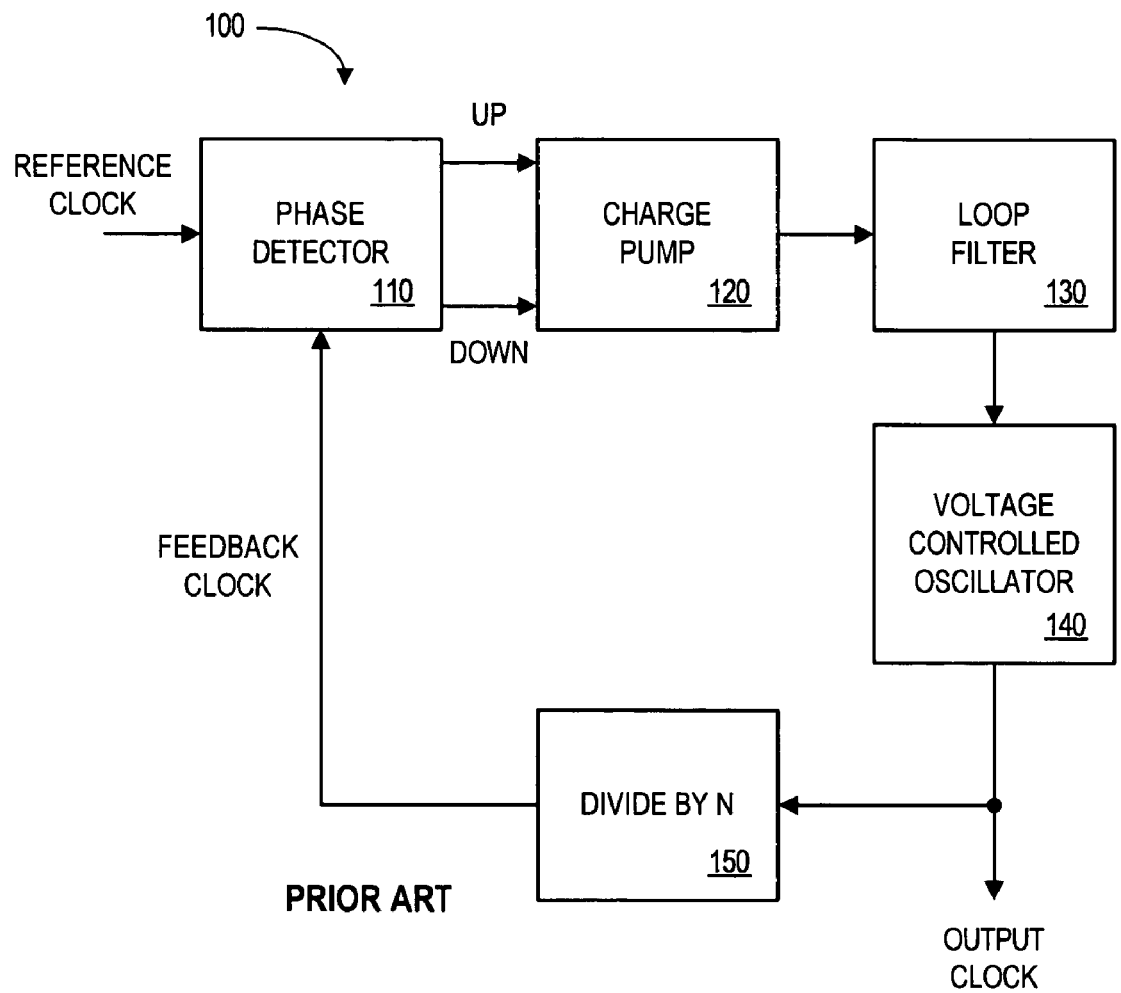
FIG. 1 is a block diagram of a known PLL circuit.
Figure 2:
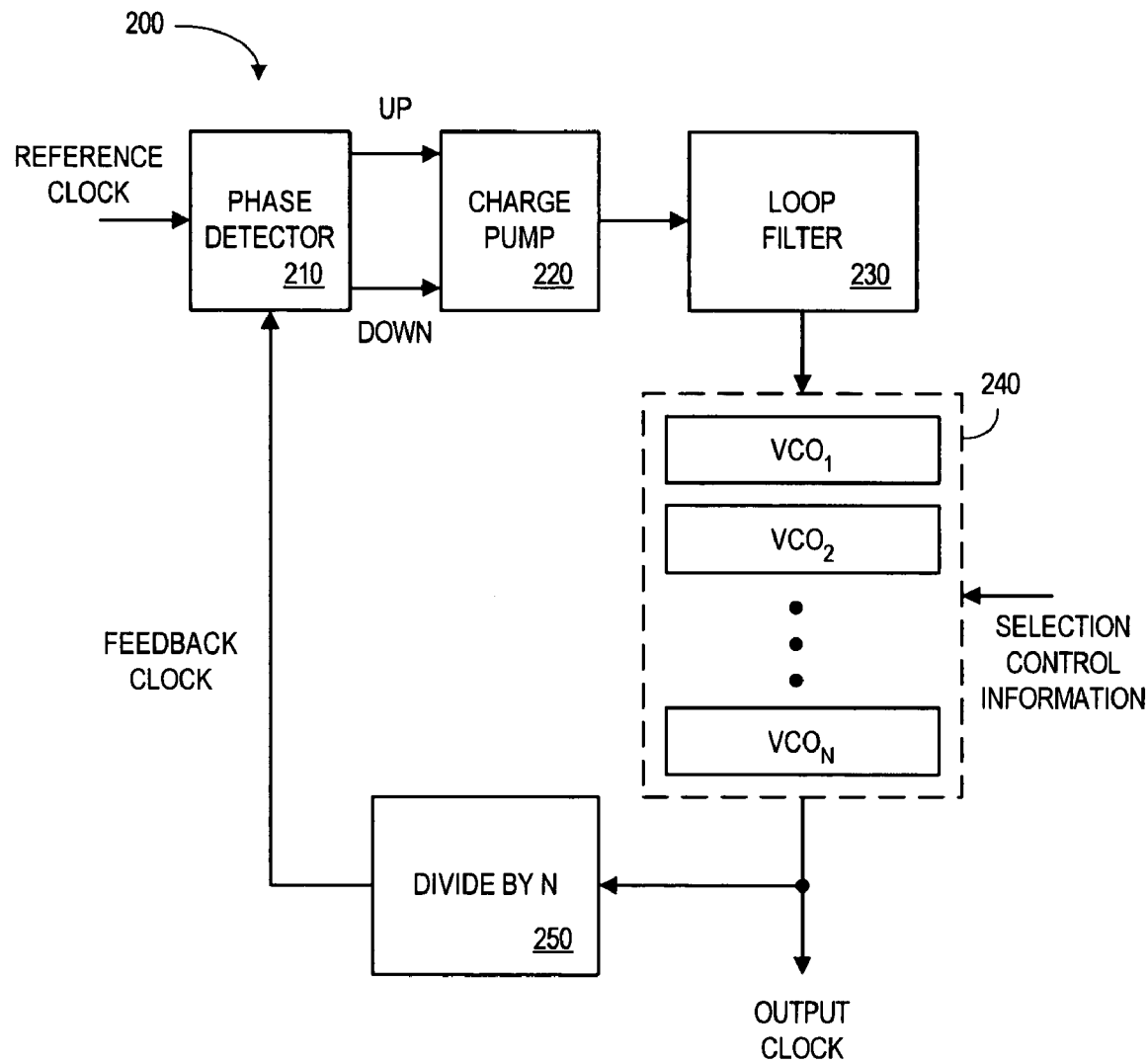
FIG. 2 is a block diagram of a PLL circuit with multiple VCOs according to some embodiments.

FIG. 2 is a block diagram of a PLL circuit 200 with multiple VCOs according to some embodiments. As in the traditional circuit, a phase detector 210 receives a reference clock signal and a feedback clock signal. Based on a difference between these two signals (e.g., a difference in phase or frequency), the phase detector 210 provides up and down signals to a charge pump 220.

According to this embodiment, the PLL circuit 200 includes multiple VCOs 240 (i.e., $VCO_1$ through $VCO_N$). Selection control information determines which of the VCOs 240 will be used to generate an output clock signal (e.g., at a frequency that is based on a signal received from the charge pump 220 via a loop filter 230). As before, a divider 250 divides the output clock signal by N to create the feedback clock signal that is provided to the phase detector 210.

Figure 3:
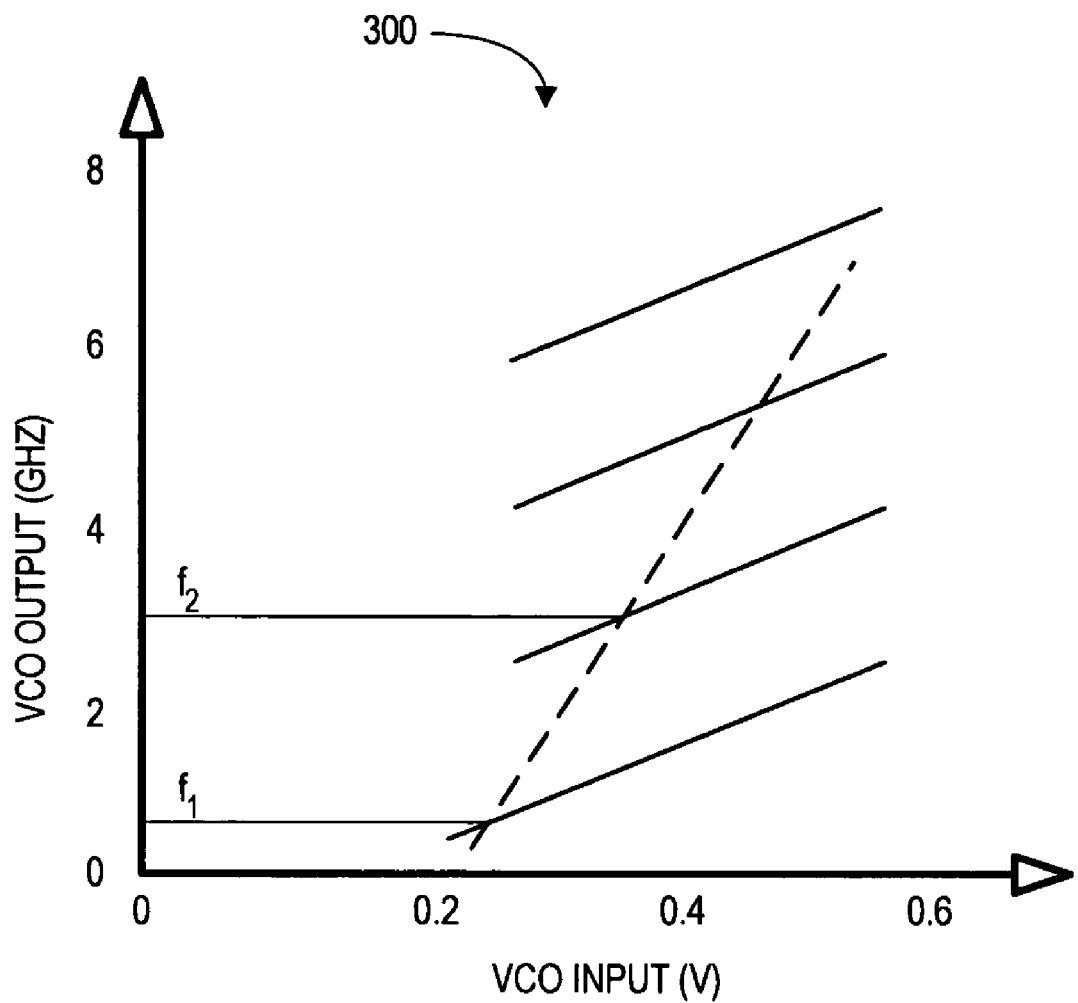
FIG. 3 is a graph illustrating VCO frequency ranges according to some embodiments.

Each of the individual VCOs 240 may be associated with a different frequency range. For example, FIG. 3 is a graph illustrating VCO frequency ranges according to some embodiments. A traditional VCO (shown as a dashed line in FIG. 3) may operate at a wide range of frequencies. Although such a traditional VCO may be versatile, it can introduce significant jitter to a PLL circuit for a jittery input clock.

According to this embodiment, the traditional VCO is replaced with multiple VCOs, each of which is adapted to operate at a different range of frequencies (as illustrated by the four solid lines in FIG. 3). Note that as a group, the multiple VCOs may still cover the same range of frequencies as the traditional VCO (enabling an equally versatile PLL circuit). Because each individual VCO is associated with a smaller frequency range, however, it may introduce less gain and jitter to a PLL circuit.

Figure 4:
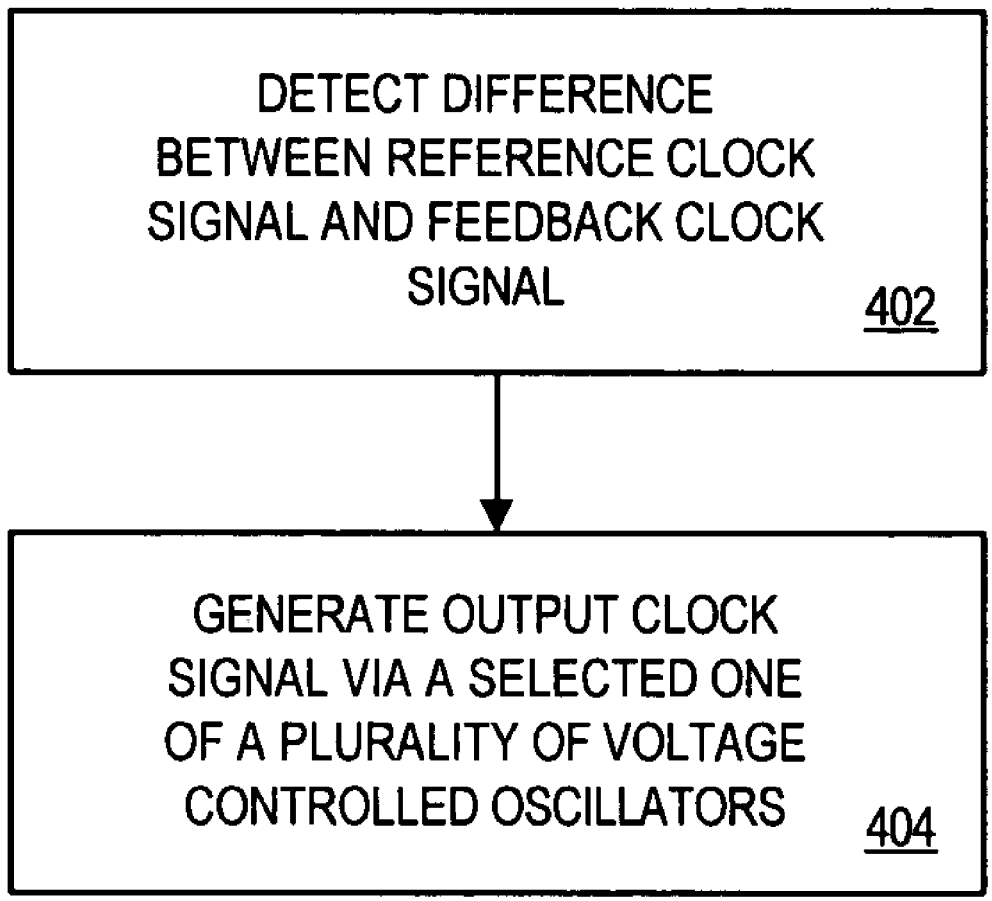
FIG. 4 is a flow chart of a method according to some embodiments.

FIG. 4 is a flow chart of a method according to some embodiments. The method may be associated with, for example, the PLL circuit 200 illustrated in FIG. 2. At 402, a difference between a reference clock signal and a feedback clock signal is detected. For example, the phase detector 210 may generate up and down signals based on a phase or frequency difference between the two clock signals.

At 404, an output clock signal is generated via a selected one of a plurality of voltage controlled oscillators based at least in part on the detected difference. For example, selection control information may be used to select one of the VCOs 240. The selected VCO 240 would then generate the output clock signal based on at least in part on the up and down signals generated by the phase detector 210 (e.g., after the information passes through the charge pump 220 and the loop filter 230).

Figure 5:
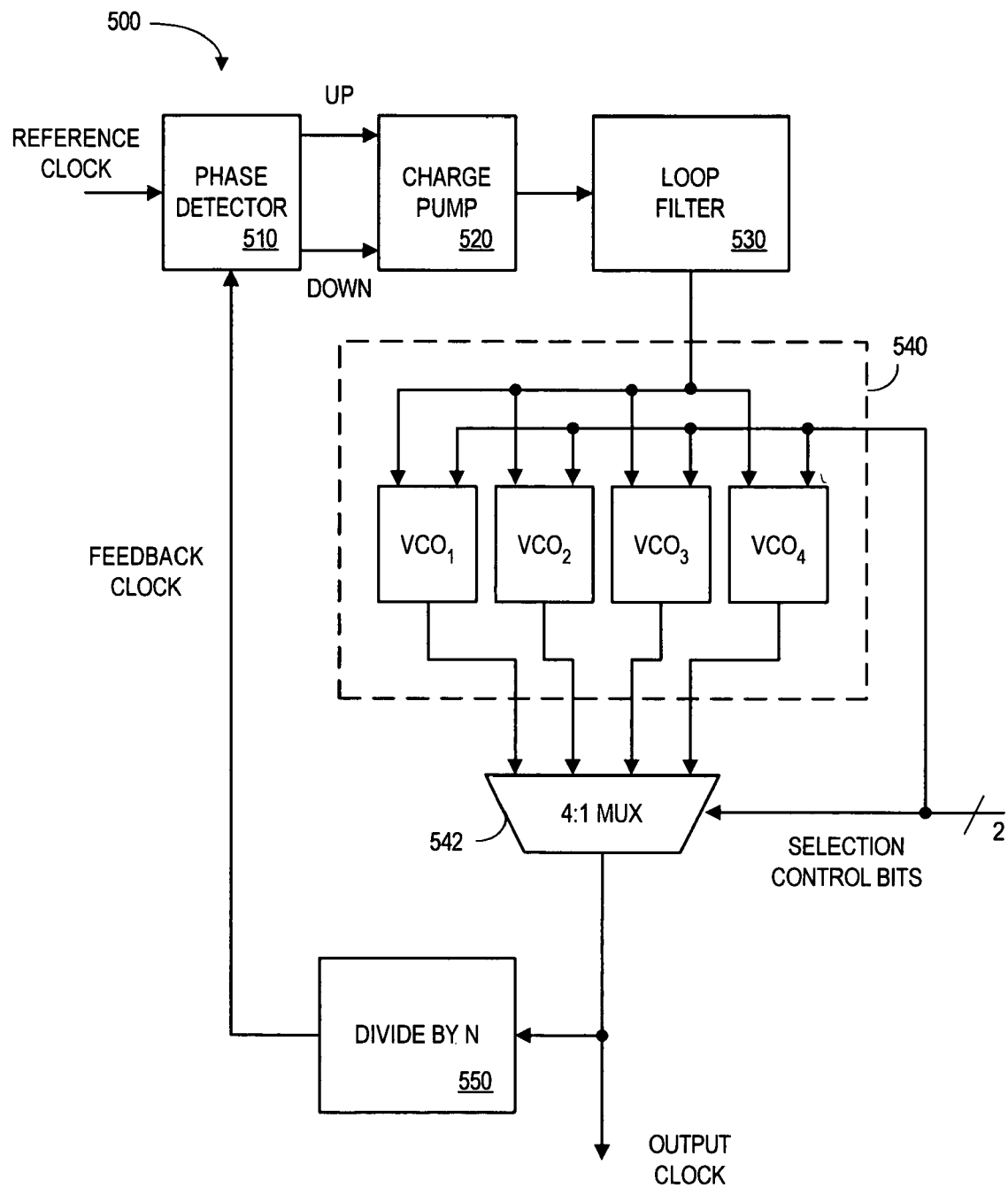
FIG. 5 is a more detailed diagram of a PLL circuit with multiple VCOs according to some embodiments.

FIG. 5 is a more detailed diagram of a PLL circuit 500 with multiple VCOs according to some embodiments. Note that the phase detector 510, charge pump 520, loop filter 530, and divider 550 may operate as described with respect to FIG. 2.

In this case, the PLL circuit 500 includes four VCOs 540 (i.e., $VCO_1$ through $VCO_4$). Each VCO 540 receives a signal from the loop filter 530 and provides a clock signal to a 4:1 multiplexer 542. Two selection control bits determine which one of those four VCO outputs is provided from the multiplexer 542 as the output clock signal. The selection control bits may be set in accordance with the frequency range associated with each VCO 540 and the desired operation of the PLL circuit 500. That is, the clock signal from $VCO_1$ might be selected if the output clock signal will have a frequency of $f_1$ while the clock signal from $VCO_2$ would be selected instead if the output clock signal was going to have a frequency of $f_2$, as indicated in FIG. 3.

Note that in this embodiment the selection control bits are also provided to the VCOs 540. For example, the selection control bits might turn off the VCOs 540 that do not need to generate clock signals. Such an approach may prevent unnecessary power dissipation.

FIG. 6 is a flow chart of a method of setting the selection control bits according to some embodiments. At 602, a frequency to be associated with a PLL circuit is determined. It is then arranged at 604 for the PLL circuit to generate an output clock signal via one of a plurality of VCOs. The method of FIG. 6 may be performed, for example, via a test operation and/or information associated with a Joint Test Action Group (JTAG) scan. The method may also be performed via firmware and/or programming. For example, a medium may store instructions adapted to be executed by a processor to perform the method of FIG. 6.

Adjustable Gain Charge Pump

Figure 7:
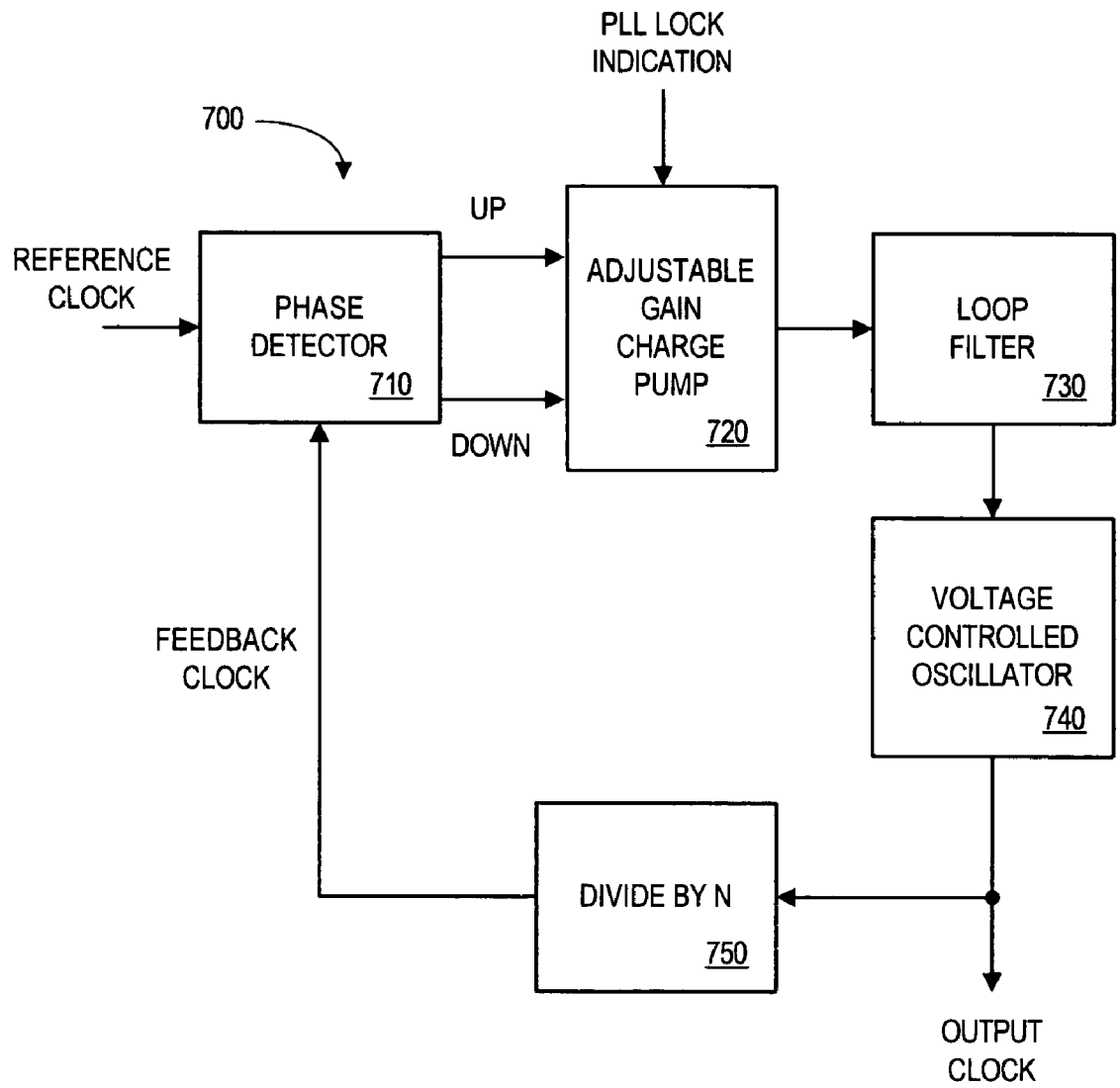
FIG. 7 is a block diagram of a PLL circuit with an adjustable gain charge pump according to some embodiments.

FIG. 7 is a block diagram of a PLL circuit 700 with an adjustable gain charge pump according to some embodiments. Note that the phase detector 710, loop filter 730, VCO 740, and divider 750 may operate as described with respect to FIG. 2.

According to this embodiment, an adjustable gain charge pump 720 receives a PLL lock indication. When the PLL lock indication reflects that the PLL circuit 700 has yet to achieve lock, the charge pump 720 is associated with a higher gain (e.g., to help the PLL circuit 700 achieve lock more quickly). When the PLL lock indication reflects that the PLL circuit 700 has achieved lock, the charge pump 720 is associated with a lower gain (e.g., to reduce the amount of jitter in the output clock signal). Note that a lower gain charge pump may mean a lower charge pump current to the loop filter.

Figure 8:
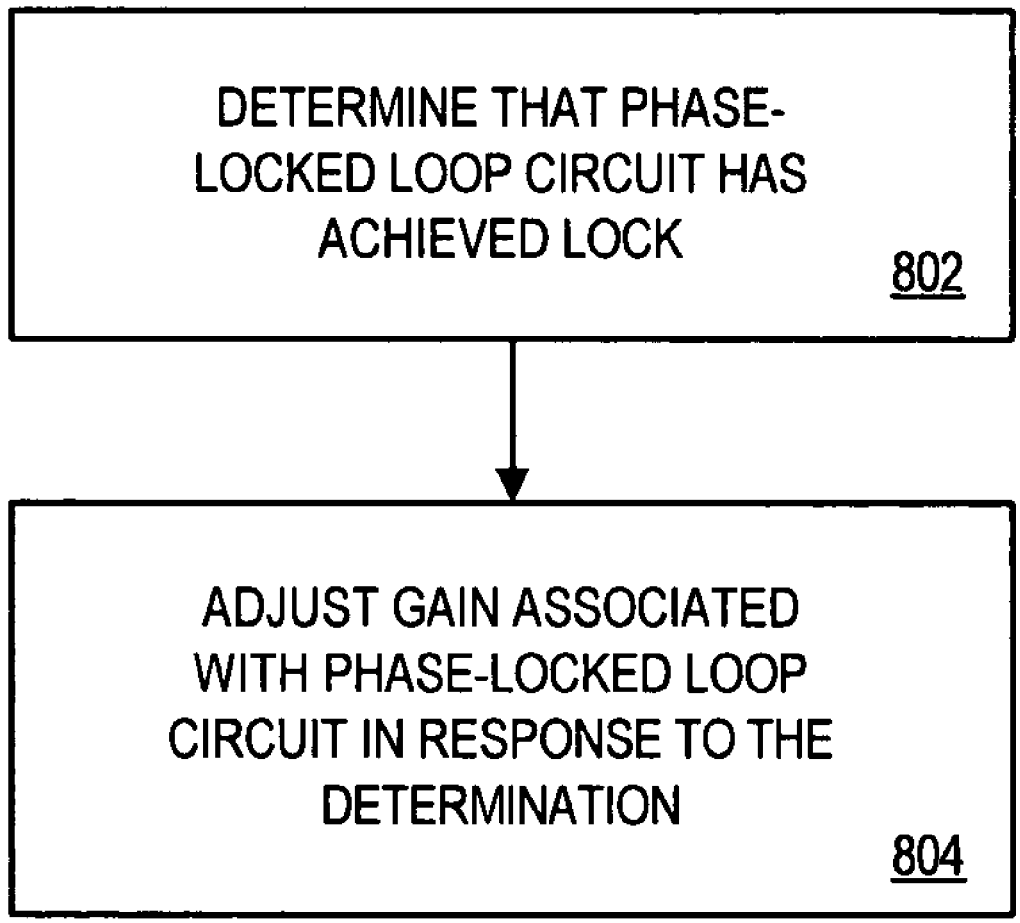
FIG. 8 is a flow chart of a method according to some embodiments.

FIG. 8 is a flow chart of a method according to some embodiments. The method may be associated with, for example, the PLL circuit 700 illustrated in FIG. 7. At 802, it is determined that a PLL circuit has achieved lock. A gain associated with the PLL circuit is then adjusted at 804 in response to the determination. For example, the gain of an adjustable gain charge pump 720 might be decreased in response to the determination. According to another embodiment, the gain of an adjustable gain loop filter is decreased.

Figure 9:
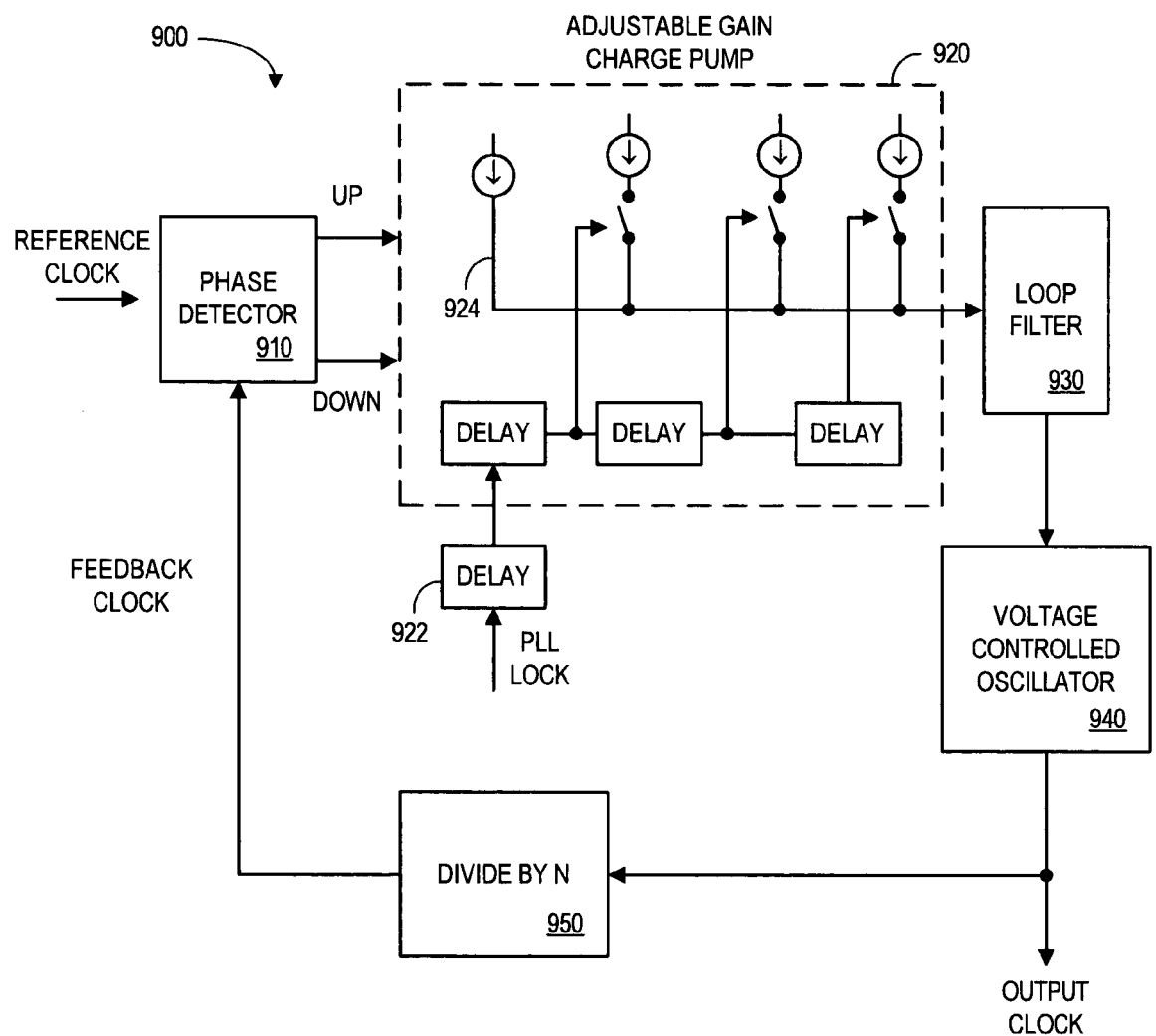
FIG. 9 is a more detailed diagram of a PLL circuit with an adjustable gain charge pump according to some embodiments.

FIG. 9 is a more detailed diagram of a PLL circuit 900 with an adjustable gain charge pump according to some embodiments. Note that the phase detector 910, loop filter 930, VCO 940, and divider 950 may operate as described with respect to FIG. 2.

An adjustable gain charge pump 920 includes a number of output stages 924. In particular, each of the four output stages 924 illustrated in FIG. 9 includes a current source. Moreover, three of the four output stages 924 can be turned on or off via a switch. In this way, the gain associated with the charge pump 920 can be adjusted (i.e., turning off output stages 924 will reduce the gain).

A PLL lock signal propagates through a number of delay elements 922, such as elements that each introduce a 10 microsecond ($\mu$sec) delay. Recall that after the PLL circuit 900 achieves lock, the gain of the charge pump 920 will be lowered (i.e., to reduce the jitter in the output clock signal). Suddenly lowering the gain by too large of an amount too quickly, however, might cause the PLL circuit 900 to lose lock entirely. To reduce this possibility, the delay elements 922 gradually reduce the gain associated with the charge pump 920 (i.e., additional output stages 924 are turned off one-by-one as the PLL lock signal propagates through the delay elements 922). In the event that the PLL circuit 900 goes out of lock, the PLL lock signal indication causes the charge pump 920 to be restored to its high gain state in order to help enable lock.

EXAMPLE

Figure 10:
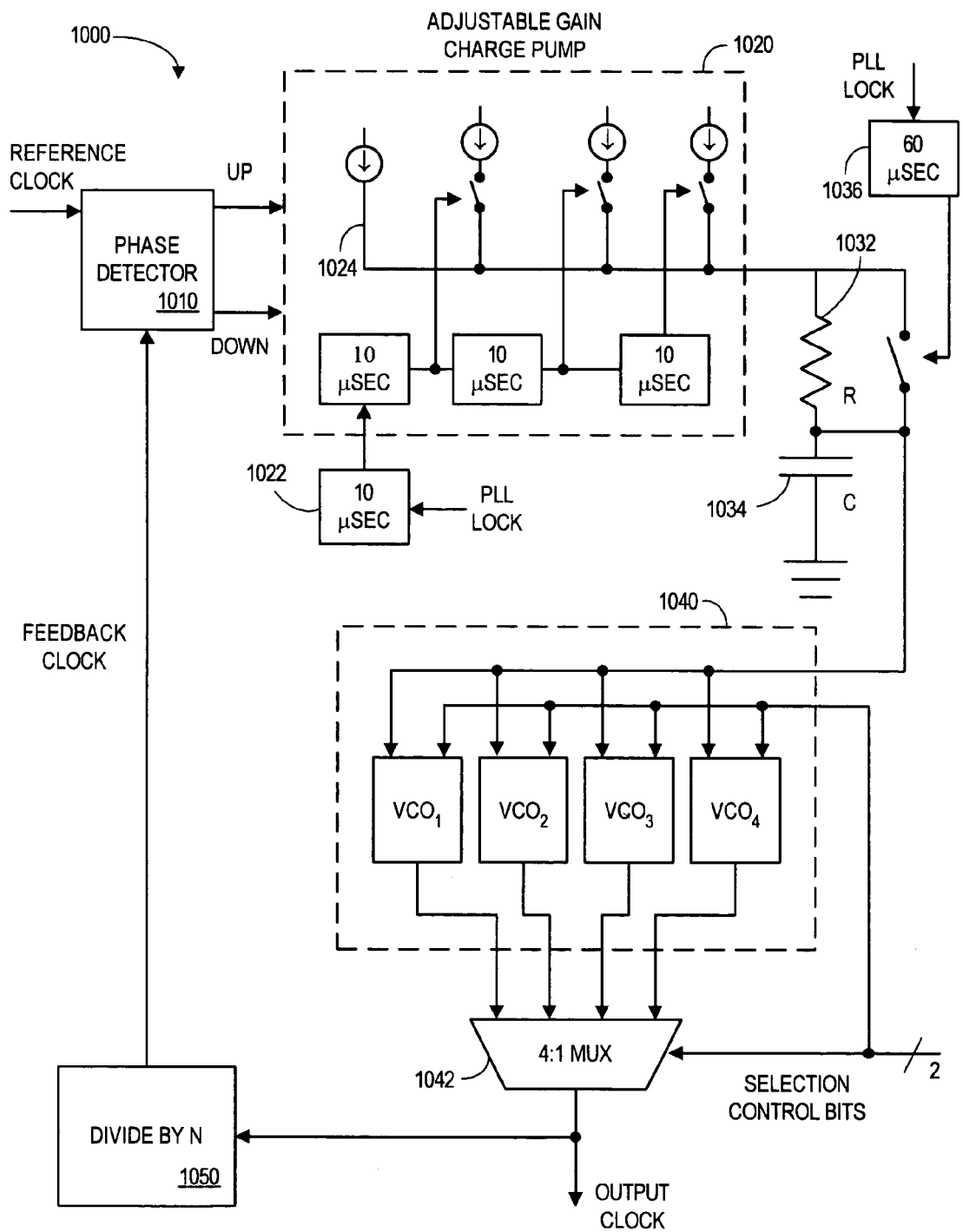
FIG. 10 is an example of a PLL circuit with multiple VCOs and an adjustable gain charge pump according to some embodiments.

FIG. 10 is an example of a PLL circuit 1000 with multiple VCOs and an adjustable gain charge pump according to some embodiments. Note that the phase detector 1010 and divider 1050 may operate as described with respect to FIG. 2.

An adjustable gain charge pump 1020 includes four current source stages 1024, three of which can be turned on or off via a switch. Initially (i.e., before the PLL circuit 1000 achieves lock), all of the output stages 1024 are turned on. As a result, the gain of the charge pump 1020 is increased and the PLL circuit 1000 can achieve lock more quickly.

After lock is achieved, a PLL lock signal is provided to a 10 $\mu$sec delay element 1022. After the signal passes through two delay elements 1022 (i.e., after 20 $\mu$sec), one of the output stages 1024 is turned off (i.e., to slightly lower the gain). Another output stage is turned off after another 10 $\mu$sec, and a third output stage is turned off after another 10 $\mu$sec. Thus, the gain associated with the charge pump 1020 is gradually reduced after the PLL circuit 1000 achieves lock.

To further improve the performance of the PLL circuit 1000, low-pass loop filter is provided via a resistor 1032 and a capacitor 1034 connected in series between the output of the charge pump 1020 and ground. Moreover, a switch can be closed to remove the resistor 1032 from the loop filter. Before the PLL circuit 1000 achieves lock, the switch is closed—increasing the gain of the PLL circuit 1000 (and helping the PLL circuit 1000 achieve lock more quickly). After lock is achieved, a PLL lock signal opens the switch after passing through a 60 μsec delay element 1036 (reducing the gain of the PLL circuit 1000 and the amount of jitter in the output clock signal). That is, increased resistive damping is introduced after lock to guard against jitter.

Note that all of the switches (i.e., in the charge pump 1020 and the loop filter) may be reset to the closed position should the PLL circuit 1000 lose lock for any reason (i.e., to increase the gain of the PLL circuit 1000 so that lock can be restored more quickly).

The output of the loop filter is provided to four VCOs 1040 (e.g., each associated with a different frequency range), each of which may provide a clock signal to a 4:1 multiplexer 1042. Two selection control bits determine which of those four clock signals is provided from the multiplexer 1042 as the output clock signal. The selection control bits are also provided to the VCOs 1040.

Thus, some embodiments may provide a low gain (and thus low jitter) PLL circuit which yet preserves a wide operational range and a capability to achieve lock quickly. Such a PLL circuit may, for example, improve the performance of an IO system or a Central Processing Unit (CPU) associated with the output clock signal.

System

Figure 11:
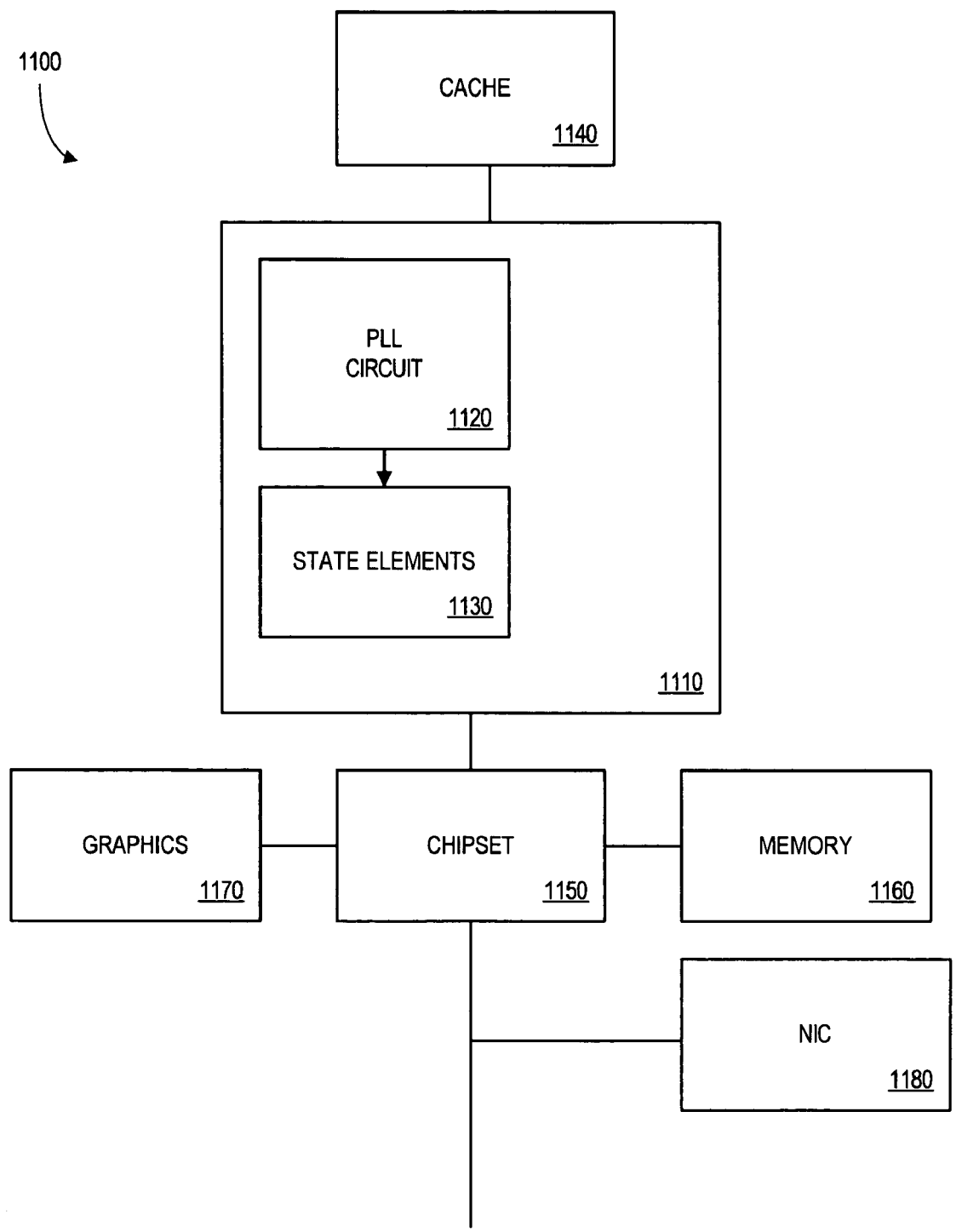
FIG. 11 is a system including an integrated circuit according to some embodiments.

FIG. 11 is a system 1100 including an integrated circuit 1110 with a PLL circuit 1120 that provides a clock signal to state elements 1130 according to some embodiments. The integrated circuit 1110 may be a microprocessor or another type of integrated circuit. According to some embodiments, the integrated circuit 1110 also communicates with an off-die cache 1140. The integrated circuit 1110 may also communicate with a system memory 1160 via a host bus and a chipset 1150. In addition, other off-die functional units, such as a graphics accelerator 1170 and a Network Interface Controller (NIC) 1180 may communicate with the integrated circuit 1110 via appropriate busses.

The PLL circuit 1120 may be associated with any of the embodiments disclosed herein, including those of FIGS. 2 through 10.

Additional Embodiments

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

Although specific circuits and components have been described herein, other embodiments may use other circuits and/or components (e.g., delay elements with different delays may be more appropriate for a specific PLL circuit).

Further, although software or hardware are described as performing certain functions herein, such functions may be performed using either software or hardware—or a combination of software and hardware.

The several embodiments described herein are solely for the purpose of illustration. Persons skilled in the art will recognize from this description other embodiments may be practiced with modifications and alterations limited only by the claims.

What is claimed is:

1. A phase-locked loop circuit, comprising:
 a phase detector; and
 an adjustable gain charge pump to receive information from the phase detector, comprising:
  a plurality of selectable output stages, and
  a delay element associated with the selection of at least one output stage, wherein the gain of the charge pump is adjusted by selection of an output stage via a propagation of a lock indication signal through the delay element.

2. The phase-locked loop circuit of claim 1, wherein the charge pump receives up and down signals from the phase detector based on a difference between a reference clock signal and a feedback clock signal.

3. The phase-locked loop circuit of claim 2, further comprising:
 a voltage controlled oscillator coupled to the charge pump via a loop filter, the voltage controlled oscillator to generate an output clock signal; and
 a divider to generate the feedback clock signal by dividing the output clock signal by N.

4. The phase-locked loop circuit of claim 1, further comprising:
 an adjustable gain loop filter.

5. The phase-locked loop circuit of claim 4, wherein the gain of the loop filter is adjusted via propagation of a lock indication signal through a delay element.

6. The phase-locked loop circuit of claim 1, further comprising:
 a plurality of voltage controlled oscillators, wherein each voltage controlled oscillator is selectable to provide an output clock signal based at least in part on information generated by the phase detector.

7. The phase-locked loop circuit of claim 6, further comprising:
 a multiplexer to output a signal generated by one of the voltage controlled oscillators as the output clock signal based on a multi-bit selection control signal.

8. The phase-locked loop circuit of claim 6, wherein each voltage controlled oscillator is associated with a different frequency range.

9. A phase-locked loop circuit, comprising:
 a phase detector;
 a charge pump to receive at least one signal from the phase detector;
 at least one voltage controlled oscillator; and
 an adjustable gain loop filter to receive a signal from the charge pump and to provide a signal to the voltage controlled oscillator, wherein the gain of the loop filter is adjusted via propagation of a lock indication signal through a delay element.

10. The phase-locked loop circuit of claim 9, wherein the charge pump comprises an adjustable gain charge pump.

11. The phase-locked loop circuit of claim 10, wherein the charge pump receives up and down signals from the phase detector based on a difference between a reference clock signal and a feedback clock signal.

12. The phase-locked loop circuit of claim 10, wherein the voltage controlled oscillator is to generate an output clock signal and further comprising:
 a divider to generate the feedback clock signal by dividing the output clock signal by N.

13. The phase-locked loop circuit of claim 9, further comprising:

a plurality of voltage controlled oscillators, wherein each voltage controlled oscillator is selectable to provide an output clock signal based at least in part on information generated by the phase detector.

14. The phase-locked loop circuit of claim 13, further comprising:
a multiplexer to output a signal generated by one of the voltage controlled oscillators as the output clock signal based on a multi-bit selection control signal.

15. The phase-locked loop circuit of claim 13, wherein each voltage controlled oscillator is associated with a different frequency range.

16. A method, comprising:
determining that a phase-locked loop circuit has achieved lock; and
propagating a lock indication signal through at least one delay element to adjust the gain of a charge pump having a plurality of selectable output stages, wherein the delay element is associated with the selection of one of the output stages.

17. The method of claim 16, further comprising:
propagating the lock indication signal through at least one other delay element to adjust the gain of a loop filter associated with the phase-locked loop circuit.

18. A method, comprising:
providing a signal from a charge pump to a loop filter;
based at least in part on the signal received by the loop filter, providing a signal from the loop filter to at least one voltage controlled oscillator;
determining that a phase-locked loop circuit has achieved lock; and
propagating a lock indication signal through at least one delay element to adjust the gain of the loop filter associated with the phase-locked loop circuit.

19. A system, comprising:
a chipset; and
a die comprising a microprocessor in communication with the chipset, wherein the microprocessor includes a phase-locked loop circuit comprising:
a phase detector, and
an adjustable gain charge pump to receive information from the phase detector, comprising:
a plurality of selectable output stages, and
a delay element associated with the selection of at least one output stage, wherein the gain of the charge pump is adjusted by selection of an output stage via a propagation of a lock indication signal through the delay element.

20. A system, comprising:
a chipset; and
a die comprising a microprocessor in communication with the chipset, wherein the microprocessor includes a phase-locked loop circuit comprising:
a phase detector, and
an adjustable gain loop filter between the phase detector and a voltage controlled oscillator, wherein the gain of the loop filter is adjusted via propagation of a lock indication signal through a delay element.

* * * * *